United States Patent
Campbell

[15] 3,644,750

[45] Feb. 22, 1972

[54] TWO-PHASE LOGIC CIRCUIT

[72] Inventor: David Campbell, Glenrothes, Scotland

[73] Assignee: General Instrument Microelectronics Ltd., Glenrothes, Scotland

[22] Filed: Sept. 9, 1970

[21] Appl. No.: 70,764

[30] Foreign Application Priority Data

June 17, 1970 Great Britain ......................29,469/70

[52] U.S. Cl. ..............................307/208, 307/205, 307/218, 307/221 C, 307/238, 307/251

[51] Int. Cl. ......................................................H03k 17/60

[58] Field of Search ..............307/205, 208, 218, 221 C, 238, 307/251, 279, 304

[56] References Cited

UNITED STATES PATENTS

| | | | |
|---|---|---|---|
| 3,395,292 | 7/1968 | Bogert | 307/279 X |
| 3,524,077 | 8/1970 | Kaufman | 307/251 X |

*Primary Examiner*—Stanley T. Krawczewicz
*Attorney*—James and Franklin

[57] ABSTRACT

A two-phase logic circuit comprises a double inverter having a series of insulated gate field-effect transistors for conditionally charging or discharging the operative node capacitances. The load FET is in series with a low-impedance switching FET which is clocked to provide a charging path during the operative clock intervals.

8 Claims, 5 Drawing Figures

INVENTOR
DAVID CAMPBELL
James and Franklin
ATTORNEYS

INVENTOR
DAVID CAMPBELL
James and Franklin
ATTORNEYS

TWO-PHASE LOGIC CIRCUIT

The present invention relates to an improved two-phase logic circuit, and particularly to such a circuit utilizing switching devices and discrete or effective capacitances capable of being rapidly charged and discharged.

Logic circuits of the type described are basic building blocks of digital data processing systems. In circuits of this type, the data is stored at one or more nodes at either of two discrete signal levels corresponding to either logic "0" condition or a logic "1" condition (arbitrarily termed "false" and "true" conditions, respectively). The circuit is adapted to perform sequential logical operations upon incoming data and provide output data in accordance with such operations. Such circuits may be used as shift registers, counters, adders and with various gates for performing specific logical operations.

In recent years, a new technology has been developed in the semiconductor art in which a plurality of switching devices are fabricated to form an integrated circuit on a chip of semiconductor material. In the fabrication of these circuit chips, and particularly where utilized in logic circuits, insulated gate or metal oxide silicon (MOS) field-effect transistors (FETs) have been found to be particularly effective as high-speed switching devices. These transistors are formed on a chip of semiconductor material by performing appropriate operations on suitably doped regions of the semiconductor substrate to produce the basic elements forming an individual FET. These elements include a control terminal generally termed the gate, and a pair of output terminals generally termed the source and drain respectively. In one type of FET if the signal at the gate is negative with respect to its output terminals, the output circuit between the source and the drain is closed, that is, the device is in the "on" state. If the signal at the gate is positive with respect to its output terminals, the output circuit is characterized by an extremely high impedance equivalent to an open circuit, that is, the device is in the "off" state. Another type of FET functions in just the opposite fashion. Thus, the FET operates as a high-speed switching device controlled by the signal level applied to its gate terminal. For purposes of explanation throughout this specification the FETs therein are described and illustrated as comprising the first type, that is, a logic "0" or more positive signal level refers to a level insufficient to turn a device "on" when applied to its gate terminal and a logic "1" or more negative signal level refers to a level which is sufficient to turn a device "on" when applied to its gate terminal.

Moreover the terms "positive" and "negative" when used in reference to a signal or charge are relative and refer to the more positive or negative of the two operative signal levels as the case may be. No external bias signals are required to operate the FET as a switching device. These devices are well suited for the mechanization of complex logic functions on a single substrate of semiconductor material by virtue of their extremely small size, low power requirement and ease of fabrication in large quantities.

In the operation of a typical logic circuit of the type described, the various logic operations are performed under the control of timed clock signals. The present circuit is adapted to be controlled by two-phase logic comprising two alternative sequential clock pulses defining two clock intervals respectively. A complete cycle of operation comprises two such intervals. During one interval a node capacitance is operatively connected to a negative reference voltage source and thereby is conditionally charged or discharged depending upon the presence or absence of a conductive discharge path across said voltage source. The availability of such a discharge path in turn depends upon the logic level of the data input signal impressed on the gate terminal of a FET disposed in such discharge path. Advantage is taken of the low "on" resistance of insulated gate field-effect transistors to provide the conductive charging and discharging paths. The infinite "off" resistance of FET devices allows the charge to be stored on a capacitor, or as is usually the case, on the inherent effective capacitance of the FET devices themselves, during the interval between clock phases, thereby maintaining the logic level prior to the next logic operation. The charge-discharge time determines the high-frequency limit while the charge leakage determines the low frequency limit. Once the capacitor has been fully charged current flow ceases and quiescent power dissipation is zero.

By means of the above process the complement of the data input signal is deposited and stored at an operative node capacitance during the first clock interval. A second stage controlled by the second clock pulse is adapted to again invert the signal thus stored and deposit the reconstitution of said input signal at the output port. In existing MOSFET logic circuits, circuit nodes are typically adapted to be charged negative by means of a clocked load device, comprising a MOSFET having a relatively high "on" resistance interposed between the reference voltage source and the nodes to be charged. The discharge path comprises a switching FET controlled by the operative data signal in series with such load device. In order to generate distinct logic "0" and "1" levels the "on" resistance of the load FET must be considerably higher than that of the switching FET. This necessitates a physically large load FET having a large gate electrode surface area and therefore a relatively large gate to drain capacitance. In typical circuits of the type described the clock capacitances are comprised primarily of the gate capacitance of the clocked load FETs. Accordingly, the power dissipated in generating the clock signals used to drive such large load FETs is a significant factor in system design. Thus, for example, in a large two-phase dynamic shift register (i.e., 200 bits long) the clock capacitance is typically about 60 pf. A system manufacturer who uses several of these registers with a common clock may find that to drive the registers at typical speeds of 1 mhz. or more presents significant power problems. Indeed, in such a case, it may be that more power is dissipated in the clock generator than in the registers themselves.

The present circuit is designed to reduce the total clock line capacitance and thus to decrease the overall system power requirement. This is accomplished by providing an additional low resistance MOSFET switching device having a relatively very low gate capacitance in series with the larger load FET device between the reference voltage source and the operative node capacitance. The gate electrodes of the load devices are tied to the reference voltage source so that they are always conductive. They therefore function as resistors alone, and not as transistors. Instead of clocking the load devices, the same effect is achieved by clocking the small low-gate-capacitance FETs. In this way the gate capacitance on the clock line and thus the power requirement is reduced by a factor of more than 10:1. Moreover, with this arrangement, and in particular because the load devices are not clocked, it becomes possible to use the same load device in the source line to successive inverter stages which are alternatively operative during the two nonoverlapping clock intervals. The elimination of half of the load FETs thus enables a significant reduction in chip area and allows for a better chip design.

Accordingly, it is a primary object of the present invention to provide a two-phase logic circuit for performing logical operations during successive clocked intervals, such circuit having a significantly reduced clock generator power requirement.

It is a further object of the present invention to provide a two-phase logic circuit of the type described in which a single load device is utilized by both inverter stages.

It is a still further object of the present invention to design a logic circuit of the type described in which the clock line power requirement is significantly reduced by providing a low resistance FET in series with the load device in the charging path.

To the accomplishment of the above, and to such other objects as may hereinafter appear, the present invention relates to a two-phase logic circuit as defined in the appended claims and as described in this specification, taken together with the accompanying drawings, in which:

Purely by way of illustration, the logic circuits herein disclosed will be described specifically with regard to their use as shift register stages, it being understood that the circuit of this invention has wide applications in performing various and complex logic operations.

Shift registers are well-known logic components. Briefly, they are designed to receive a data signal and, controlled by a shifting or clock signal, to transfer that data signal to another circuit of the same or different character during successive clock intervals. A plurality of such circuits may be connected together, the data signal finally emerging from the last stage after it has been shifted serially from circuit to circuit through the entire array during a series of clock intervals. Shifting of this type is required, for example, during multiplication before adding partial products or in converting from serial to parallel computer operation or vice versa.

Figure 1:
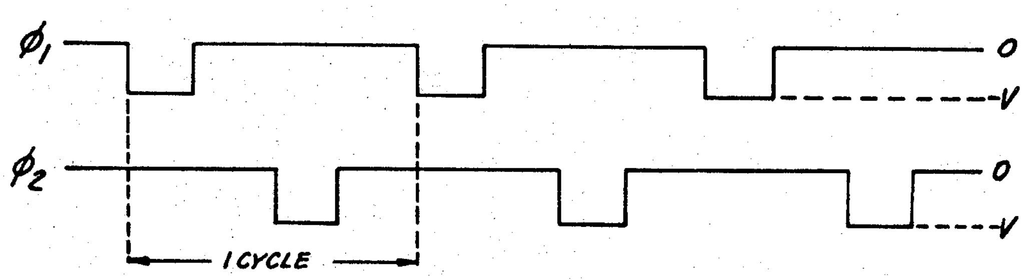
FIG. 1 is a graphical representation of the time relationship between the two clock phases utilized by the present circuit.

Two-phase logic circuits of the type described are controlled by two clock signals having alternately timed clock pulses. FIG. 1 illustrates the time relationship between the two clock signals $\phi1$ and $\phi2$, here employed, time being represented on the horizontal axis and signal amplitude being represented on the vertical axis. By way of example, the clock signals may be considered as being normally at ground, and as having a recurring negative pulse of $-V$ volts. The interval during which the signal is negative ($-V$) is designated as the time of that clock pulse i.e., "$\phi1$ time" refers to that interval during which the $\phi1$ clock signal is negative. The two clock signals $\phi1$ and $\phi2$ here employed are unique and spaced from one another at both their leading and trailing edges, i.e., there is an interval between $\phi1$ time and $\phi2$ time and between $\phi2$ time and $\phi1$ time. Clock phases $\phi1$ and $\phi2$ may be produced by any conventional clock generator circuit.

In a dynamic shift register each stage receives clock pulses which are effective on each clock pulse cycle to shift or transfer data from one stage to a succeeding stage. The period of each clock pulse cycle is usually designated as one bit of data transfer so that each data shifting operation is performed during each bit. The unit of a shift register capable of introducing a time delay of one bit (i.e., one cycle) to a signal is also referred to as one bit or stage of the register. Thus, for a shift register having 10 bits the data would appear at the output stage, 10 bits after it is applied to the input stage, that register being designated as a 10-bit register.

Figure 2:
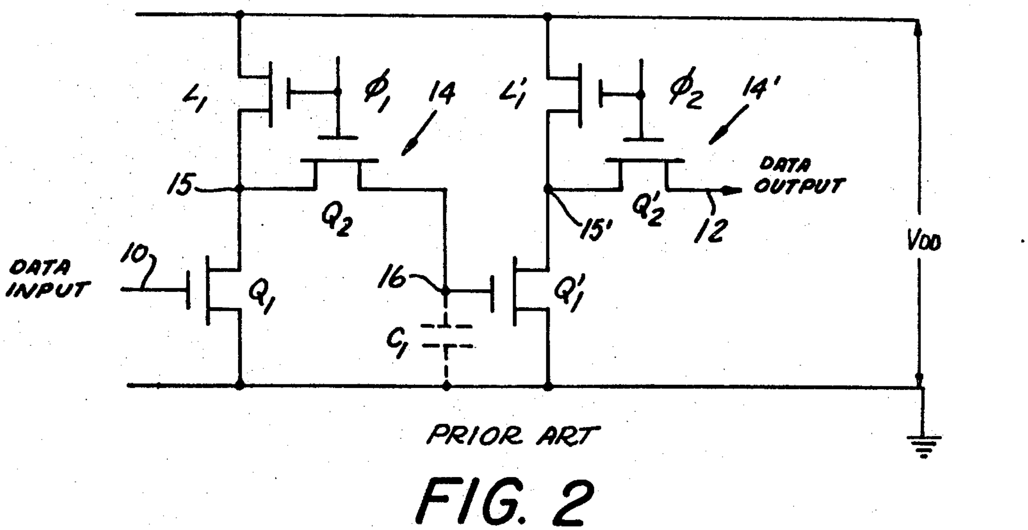
FIG. 2 is a circuit diagram of one stage of a prior art two-phase dynamic shift register utilizing conditional charge-discharge and having a clocked load device in the charging path.

FIG. 2 illustrates a prior art two-phase dynamic shift register. Only one bit of the register is here specifically illustrated, it being understood that as many such bits or stages as desired may be connected serially or otherwise in order to produce the desired degree of delay, the desired number of memory stages, or to satisfy any other external requirement. Each bit comprises an input port 10 and an output port 12 between which are connected in series a pair of identical inverter stages generally designated 14 and 14'. Since the inverter stages are identical, the elements of inverter state 14' will be designated by like reference numerals except for the addition of a prime. Inverter stage 14 comprises a load FET L1 and a low impedance switching FET Q1 connected in series across a suitable negative reference voltage source $V_{DD}$, the negative side shown as the top line and the positive side shown as the bottom line and being connected to ground.

The gate terminal of the load FET L1 is impressed with the $\phi1$ clock signal and the gate terminal of FET Q1 is connected to the data input port 10 and is adapted to receive the data input signal. A second switching device FET Q2 is connected between a node 15 formed at the junction of the output circuits of FETs L1 and Q1 and an inverter node designated 16. The gate terminal of FET Q2 is also impressed with the $\phi1$ clock signal.

FETs Q1 and Q2 are typical low resistance switching FETs, i.e., their "on" impedances are extremely low and are equivalent for most purposes to an open circuit. The load FET L1, on the other hand, is a rather high resistance device typically having an "on" impedance of at least 10 times that of switching FETs Q1 and Q2.

During $\phi1$ time FETs L1 and Q2 are rendered conductive by the application of the $\phi1$ clock pulse to their gate terminals. If the input data signal at input port 10 is positive (logic "0"), FET Q1 will be rendered nonconductive and inverter node 16 will be charged negative by the $V_{DD}$ voltage source through conductive FETs L1 and Q2. If, however, the input data signal at input port 10 is negative (logic "1") FET Q1 will be rendered conductive thereby providing a discharge path through FETs L1 and Q1 across voltage source $V_{DD}$. Accordingly, by virtue of the voltage divider action of high resistance FET L1 and low impedance FET Q1, the voltage at junction node 15 will be close to ground and inverter node 16 will be left at a logic "0" level regardless of the charge level remaining thereon from a previous cycle. Thus, if inverter node 16 is initially at logic "0" it will remain at such level since the charging path has been shorted through Q1. If inverter node 16 is initially at logic "1" it will be discharged during $\phi1$ time through FETs Q2 and Q1. The necessity of designing L1 as a relatively high resistance device will now become apparent. In the event of a logic "1" signal at input port 10 the voltage at inverter node 15 is a function of the impedance ratio of FET L1 to FET Q1, the higher such ratio the closer node 15 is drawn to ground. The 10:1 impedance ratio here employed insures that when the data input signal is negative the voltage level at junction node 15 and thus at inverter node 16 will be insufficient to render the input FET Q1' of the next inverter stage conductive, that is, when the data input signal is at logic "1," the signal at inverter node 16 will be at logic "0." The signal at inverter node 16 is stored on capacitor C1 here indicated in broken lines and representing the combined effects of the interelectrode capacitances of FETs Q2 and Q1'. During $\phi2$ time the signal stored on capacitor C1 is again processed in like manner through inverter stage 14' and the complement thereof appears at output port 12. Thus, if the signal stored on capacitor C1 at the end of $\phi1$ time is negative (logic "1"), the $V_{DD}$ voltage source will be discharged through conductive FETs L1' and Q1', the signal at junction node 15' and output port 12 being drawn to a logic "0" level. If the signal stored on capacitor C1 was positive (logic "0") at the end of $\phi1$ time then output port 12 will be charged negative by reference voltage $V_{DD}$ through conductive FETs L1' and Q2' during $\phi2$ time, junction node 15' and output port 12 being effectively isolated from ground by nonconductive FET Q1'. It will be apparent that the data input signal at input port 10 will be twice inverted during one clock cycle and will be reconstituted at output port 12 after a one bit or one cycle delay.

In the prior art circuit the load FET L1 must be clocked in order to prevent quiescent power dissipation in the interval between logic operations as a result of the discharge circuit defined by FETs L1 and Q1. Thus, if the data input signal at input port 10 is negative, current will continue to flow through the discharge path via FETs L1 and Q1 after $\phi1$ time unless load FT L1 is rendered nonconductive during this time. However, as noted previously, the clocking of the load device produces two undesirable results: first, as a result of the increased clock line capacitances, the power requirements for the clock generator, especially when several circuits are used with a common clock, may present a considerable problem; second, because the load device is only conductive during the time of the clock pulse which is applied to its gate terminal, each inverter stage requires a separate load device (L1 and L1' respectively) in its charging path, necessitating a rather large chip area.

Figure 3:
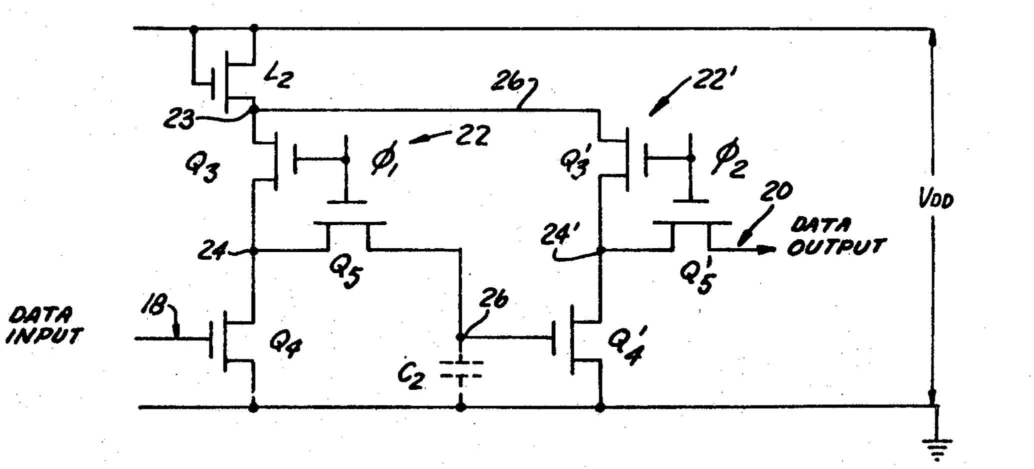
FIG. 3 is a circuit diagram of one stage of a shift register utilizing the circuit of the present invention, in which the load device is unclocked.

FIG. 3 illustrates a two-phase dynamic shift register state incorporating the circuit of the present invention. Again, only one bit or stage of the register is here specifically illustrated, such bits or stages being similarly adapted to be connected serially or otherwise to satisfy any design requirement. Each bit comprises a data input port 18, a data output port 20 and a pair of serially connected inverter stages generally designated 22 and 22' respectively, the elements of inverter stage 22' again being designated by like reference numerals except for the addition of a prime. Inverter stage 22 comprises a load FET L2 and two switching FETs Q3 and Q4 connected in series across the $V_{DD}$ negative voltage supply.

Load FET L2 has its gate terminal and one output circuit terminal tied to the negative side of the $V_{DD}$ supply voltage, its other output circuit being connected to the output circuit of switching FET Q3 at node 23. A third switching device Q5 has an output circuit terminal connected to a junction node 24 defined at the junction between the output circuits of FETs Q3 and Q4, its other output circuit terminal being connected to inverter node 26. The gate terminals of FETs Q3 and Q5 are both impressed with the $\phi 1$ clock signal. The gate terminals of FETs Q3 and Q5 are both impressed with the $\phi 1$ clock signal. The gate terminal of FET Q4 receives the data input signal at input port 18. Load FET L2, by virtue of having its gate terminal tied to the $V_{DD}$ supply is adapted to function only as a resistor and continuously provide a conductive path of predetermined appreciable resistance from the $V_{DD}$ supply to node 23.

During $\phi 1$ time, FETs Q3 and Q5 are rendered conductive. If the data input signal at data input port 18 is positive (logic "0"), FET Q4 will be rendered nonconductive thereby isolating junction node 24 from ground and enabling inverter node 26 to be charged negative by the $V_{DD}$ voltage source through conductive FETs L2, Q3 and Q5. If, however, the data input signal at data input port 18 is negative (logic "1"), FET Q4 will be rendered conductive thereby providing a discharge path across voltage source $V_{DD}$ via conductive FETs L2, Q3 and Q4. Thus, by virtue of the voltage divider action of FETs L2, Q3, and Q4, the voltage at junction node 24 will be close to ground (logic "0") and inverter node 26 will be discharged to or remain at logic "0." Here again, capacitor C2 connected between inverter node 26 and ground is shown in broken lines and indicates in this embodiment the combined effects of the interelectrode capacitances of FETs Q5 and Q4'.

At the end of $\phi 1$ time FETs Q3 and Q4 are rendered nonconductive and thus the signal at node 26, representing the complement of the data input signal, is stored on capacitor C2 and effectively isolated from both the negative and ground sides of the $V_{DD}$ voltage supply. Also at this time (the termination of $\phi 1$ time) current flow through load FET L2 ceases since inverter stage 22 is inoperative.

Since load device L2 is still conductive and since inverter stages 22 and 22' are never operative at the same time, it is possible for the two inverter stages to time share a single load device L2. Accordingly, FET Q3' of the second inverter stage 22' has one of its output circuit terminals connected to the output of load device L2 at node 23 through lead line 26.

During $\phi 2$ time FETs Q3 and Q5' are rendered conductive and thus output port 20 is charged to a logic "0" or logic "1" level depending upon the signal stored on capacitor C2. Thus, if the signal on capacitor C2 is positive (logic "0") at the end of $\phi 1$ time output port 20 will be charged negative by the $V_{DD}$ supply through conductive FETs L2, Q3' and Q5''. If, however, capacitor C2 is charged negative (logic "1") during $\phi 1$ time, FET Q4' will be rendered conductive and provide a discharge path via conductive FETs L2, Q3' and Q4' across the $V_{DD}$ supply during $\phi 2$ time, thereby leaving the signal at data outport port 20 at a positive or logic "0" level.

It will be apparent that this new circuit is adapted to perform the same logical operations as the prior art device by means of the same high speed conditional charge-discharge method. However, the system power requirement has been reduced significantly by clocking a low impedance switching FET Q3 instead of the load FET L2. Indeed, as previously noted the load device L2 in my new circuit functions essentially as a high resistance and not as a transistor. Moreover, because the switching characteristics of the load device have been eliminated such device may be time shared between successive inverter stages which operate respectively during the two nonoverlapping successive clock intervals.

By applying suitable logic configurations to the data input port it is possible to perform a variety of logical operations with the circuit of this invention. By way of example, FIGS. 4 and 5 show data input arrangements upon which the circuit is adapted to perform the logical "AND" and "OR" operations, respectively.

Figure 4:
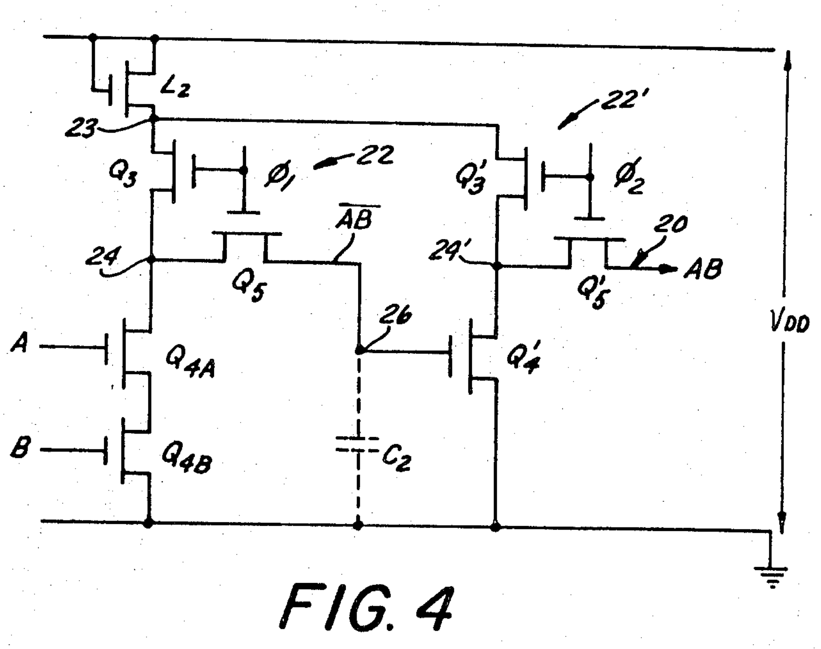
FIG. 4 is a circuit diagram of an AND gate utilizing the circuit of the present invention.

Referring to FIG. 4, two data input signals A and B are applied to the gate terminals of two serially connected FETs Q4A and Q4B, respectively. It will be noted that when either of the input signals A or B is false, the discharge path from junction node 24 to ground is an open circuit and thus inverter node 26 is charged negative by the $V_{DD}$ voltage source during $\phi 1$ time through conductive FETs L1, Q2 and Q3. This makes the signal at inverter node 26, at the end of $\phi 1$ time, the "-NAND" function ($\overline{AB}$) of data input signals A and B, that is to say, the output at node 26 is false only if both inputs A and B are true. During $\phi 2$ time the second inverter state 22' will provide at output port 20 the complement of the signal at inverter node 26. Or, in other words, the "AND" function (AB) of input signals A and B; the output is true only when both inputs are true.

Figure 5:
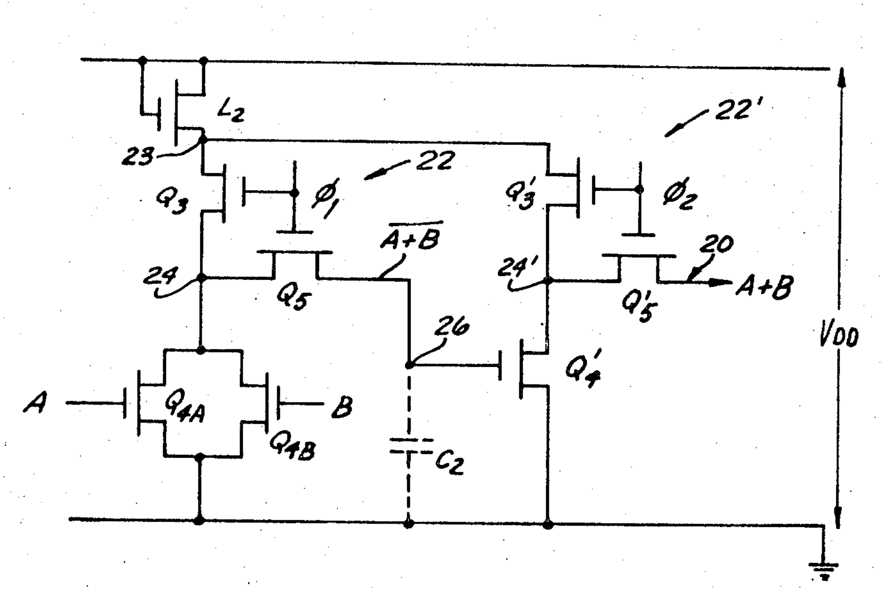
FIG. 5 is a circuit diagram of an OR gate utilizing the circuit of the present invention.

The OR gate embodiment shown in FIG. 5 is similar to the AND gate of FIG. 4 except that here the input FETs Q4A and Q4B have their output circuits connected in parallel between junction node 24 and ground. Thus, the discharge path from node 24 will be closed if either of FETs Q1A or Q1B are conductive. Accordingly, the signal at inverter node 26 will be false and that at output port 20 will be true if either of input signals A or B is true or if both are true.

It will be apparent from the foregoing that any number of input FETs may be connected in series or in parallel or combinations thereof to provide an unlimited number of logical operations. Moreover, as with the register stage previously described, any number of gates or stages may be connected in any desired manner to perform more complex operations.

The present invention provides a significantly improved high speed logic circuit. The power required to drive the circuit of the present invention may be reduced considerably over that required to drive the prior art circuit. Thus, in the prior art circuit, load FETs L1 and L1' must be high impedance devices for reasons previously described. This means that the ratio of channel length to width must be relatively high. Even if the width is reduced to the minimum value which present manufacturing processes are able to handle, (approximately 0.2 mil), the length would still have to be approximately 4.5 mil. Thus, the area of thin oxide represented by the gate terminal must be at least $4.5 \times 0.2$ or 0.9 $mil^2$. In the new circuit configuration the clocked switching device FET Q3 in the charging path has typical dimensions of 0.4 mil by 0.2 mil width or a 0.08 $mil^2$ surface area. Accordingly, the gate electrode surface area and thus the gate capacitance on the clock line (which is proportional to surface area) is reduced by a factor of more than 10:1 when compared with the prior art.

Finally, by reducing the number of long, narrow load FETs in this new circuit configuration a significant improvement in the yield of good circuits on a wafer may be achieved, as well as a considerable reduction in chip area.

While only three embodiments of the present invention have been here specifically described, it will be apparent that many variations may be made therein, all within the scope of the instant invention as defined in the following claims.

I claim:

1. A logic circuit for performing a logical operation on one or more data signals during a period defined by first and second clock intervals, comprising a data input having one or more data input nodes each adapted to receive a data signal at one of a first or second logic level, an output node, a reference voltage node, a reference voltage source, a load device connected between said reference voltage node and one side of said reference voltage source, first switch means effective to operatively connect said output node to said reference voltage node during said first clock interval and to operatively disconnect said output node from said reference voltage node during said second clock interval, said first switch means having a substantially lower output impedance than said load device, second switch means operatively connected to said input node and effective to operatively connect said reference voltage node to the other side of said reference voltage source during said first clock interval in response to a predetermined voltage level configuration of said data input, and to operatively disconnect said reference voltage node from the other side of said reference voltage source during said second clock period.

2. The circuit of claim 1 wherein said first and second clock intervals are defined by a control voltage source having a timed clock pulse, said first interval being defined by the duration of said pulse, said second interval being defined by the time between consecutive pulses, said first switch means comprising first and second switch devices, each having two output circuit terminals and a control terminal, the output circuit terminals of said first and second switch devices being connected in series between said reference voltage node and said output node, their control terminals being connected to said control voltage source.

3. The circuit of claim 2, wherein said second switch means comprises a third switch device connected between said other side of said reference voltage source and the junction between the output terminals of said first and second switch devices.

4. The circuit of claim 2, wherein said data input comprises a single data input node and said second switch means comprises a third switch device having two output circuit terminals and a control terminal, said control terminal of said third switch device being connected to said data input node, said output circuit terminals of said third switch device being connected between said other side of said reference voltage source and the junction between the output terminals of said first and second switch devices.

5. A shift register comprising first and second circuits in accordance with claim 4, connected in series, the output node of said first circuit being connected to the input node of said second circuit, said clock pulses of said first and second circuits being alternate and nonoverlapping.

6. The circuit of claim 5, wherein said reference voltage nodes of said first and second circuits are connected together, said load devices of said first and second circuits comprising a single load device connected between said reference voltage source and the reference voltage nodes of said first and second circuits.

7. The circuit of claim 2, wherein said data input comprises a plurality of data input nodes and said second switch means comprises a plurality of switch devices each having two output circuit terminals and a control terminal, said control terminals of said plurality of switching devices being connected to said plurality of data input nodes respectively, the output circuit terminals of said plurality of switch devices being connected in series between said other side of said reference voltage source and the junction between the output circuit terminals of said first and second switch devices.

8. The circuit of claim 2, wherein said data input comprises a plurality of data input nodes and said second switch means comprises a plurality of switch devices, each having two output circuit terminals and a control terminal, said control terminals of said plurality of switching devices being connected to said plurality of data input nodes respectively, the output circuit terminals of said plurality of switch devices being connected in parallel between said other side of said reference voltage source and the junction between the output circuit terminals of said first and second switch devices.

* * * * *